Aug. 5, 1969 J. H. SCOTT, JR 3,460,007

SEMICONDUCTOR JUNCTION DEVICE

Filed July 3, 1967 3 Sheets-Sheet 1

INVENTOR
JOSEPH H. SCOTT, JR.

BY Abraham Sherman
ATTORNEY

Aug. 5, 1969 J. H. SCOTT, JR 3,460,007

SEMICONDUCTOR JUNCTION DEVICE

Filed July 3, 1967 3 Sheets-Sheet 2

INVENTOR
JOSEPH H. SCOTT, JR.

BY Abraham Sherman
ATTORNEY

Aug. 5, 1969 J. H. SCOTT, JR 3,460,007

SEMICONDUCTOR JUNCTION DEVICE

Filed July 3, 1967 3 Sheets-Sheet 3

INVENTOR
JOSEPH H. SCOTT, JR.

BY Abraham Sherman
ATTORNEY

United States Patent Office 3,460,007

Patented Aug. 5, 1969

3,460,007

SEMICONDUCTOR JUNCTION DEVICE

Joseph H. Scott, Jr., Newark, N.J., assignor to RCA Corporation, a corporation of Delaware Filed July 3, 1967, Ser. No. 650,978
Int. Cl. H01l *11/00, 15/00*
U.S. Cl. 317—235 8 Claims

ABSTRACT OF THE DISCLOSURE

A semiconductor junction device is provided comprising a given conductivity type monocrystalline silicon body having a partly masked surface. On the unmasked portion of the body surface is a layer of low resistivity polycrystalline silicon having an opposite conductivity type modifier incorporated therein. A portion of the silicon body immediately adjacent the polycrystalline layer is of opposite conductivity type, due to diffusion of the conductivity modifier from the polycrystalline layer into the monocrystalline body. On the polycrystalline layer is a layer of high resistivity material, and on the high resistivity layer is an electrical contact. The electrical contact may be another layer of low resistivity polycrystalline silicon.

BACKGROUND OF THE INVENTION

Field of the invention

This invention relates to improved semiconductor junction devices and their fabrication, and more particularly to improved devices such as triode transistors having a resistance in series with the emitter region.

Description of the prior art

Transistors capable of handling high power at high frequencies are limited in their operating characteristics by an undesirable phenomenon known as second breakdown, in which the emitter current concentrates in local regions and destructively overheats these regions, therefore called "hot spots." Transistors in which the emitter has been sub-divided into a plurality of isolated regions connected in parallel also exhibit second breakdown. It has been suggested that a distributed resistance in series between the emitter contact and the emitter region will minimize second breakdown. For a description of some transistors of this type, see U.S. Patent 3,286,138, issued to W. Shockley on Nov. 15, 1966.

One method of controlling the size and shape of diffused regions in a semiconductive body comprises depositing a coating of refractory insulating material containing a conductivity modifier on a predetermined portion of the body surface. The coated body is then heated to diffuse the conductivity modifier from the coating into that portion only of the body immediately adjacent the coating. Since the diffusion source is a solid, the process is known as solid-to-solid diffusion. For details, see U.S. Patent 3,200,019, issued Aug. 10, 1965, to Scott and Olmstead.

In prior art fabrication methods, after the formation of a diffused region adjacent one face of a semiconductive body, this face is exposed to the deleterious effects of the ambient atmosphere. Moreover, additional processing steps are required to form an electrical contact to the diffused region.

It is an object of this invention to provide an improved method of making improved semiconductor junction devices wherein a solid diffusion source is not only left on the surface of a crystalline semiconductive body as a protective cover over the device junction, but also is utilized as an electrical contact to the diffused portion of the body immediately adjacent the diffusion source.

Summary of the invention

A semiconductor junction device is made by depositing a first layer of polycrystalline semiconductive material on a monocrystalline semiconductive body. The polycrystalline layer contains a conductivity modifier capable of altering the conductivity type of the body. The conductivity modifier is diffused from the polycrystalline layer into the body, and converts this diffused portion to opposite type conductivity. A layer of high resistivity material is deposited on the first polycrystalline layer. A second layer of polycrystalline semiconductive material is deposited on the high resistivity layer, and serves as an electrical connection to the diffused portion.

DESCRIPTION OF THE PREFERRED EMBODIMENTS

First apparatus

Figures 1, 2:
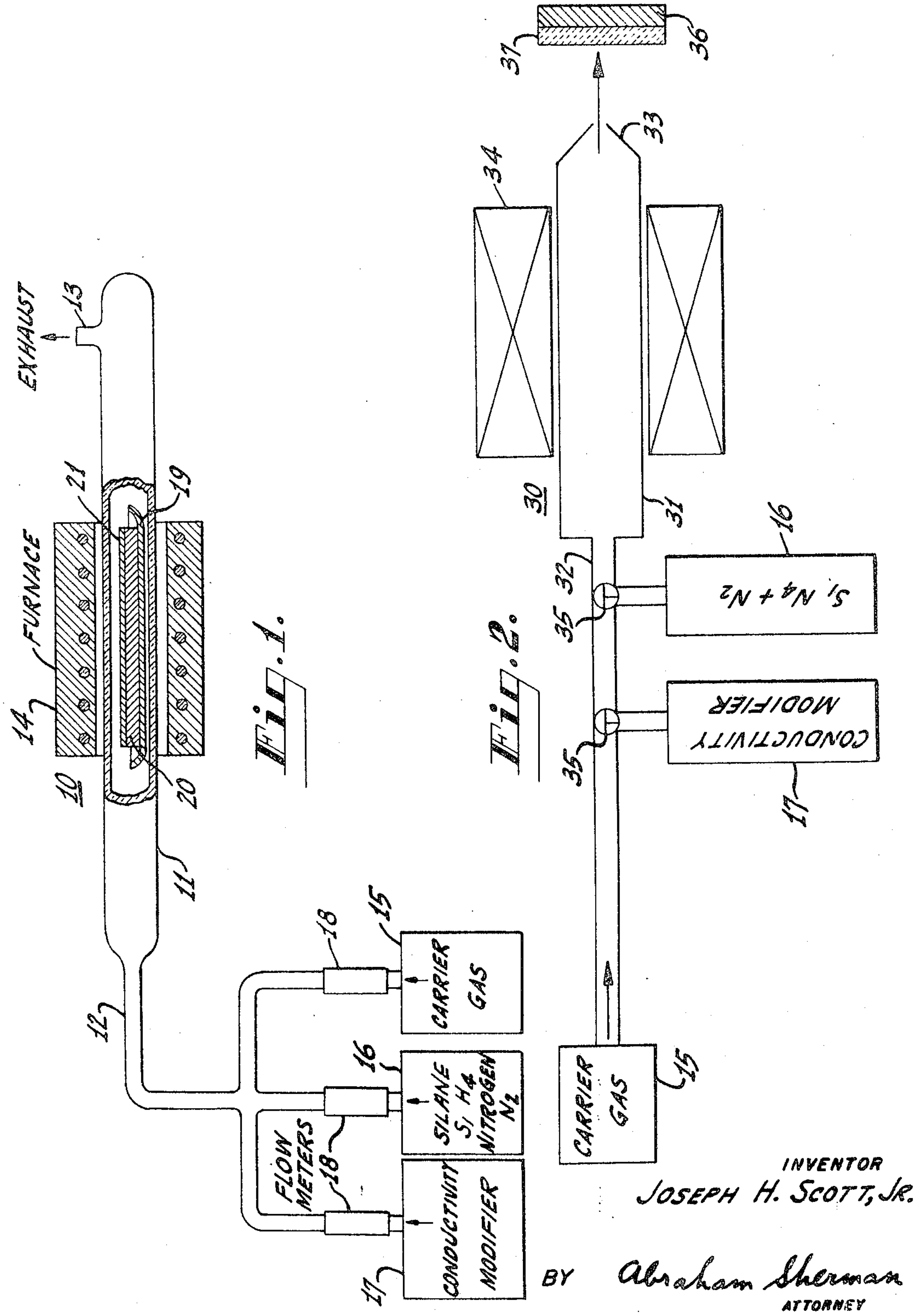
FIGURE 1 is a schematic sectional view of a first form of apparatus useful in the practice of the invention.
FIGURE 2 is a schematic sectional view of a second form of apparatus useful in the practice of the invention.

One form of apparatus 10 (FIGURE 1) useful in the practice of the invention comprises a refractory furnace tube 11, which may for example consist of a high melting glass, fused silica, or the like. The furnace tube 11 is provided with an inlet tube 12 at one end, and an outlet 13 at the other end. The furnace tube 11 is positioned with its central portion in a furnace 14, which may, for example, be an electrical resistance furnace. A carrier gas tank 15, a silane tank 16, and a tank 17 containing a volatile conductivity modifier, are all arranged to feed into the inlet 12 of furnace tube 11. It has been found preferable to utilize the silane in the form of a diluted mixture consisting of about 1 to 10 volume percent silane, the balance an inert gas such as nitrogen or argon. The carrier gas suitably consists of an inert gas such as nitrogen or the like. The conductivity modifier may be either an acceptor or a donor. When the semiconductor utilized is silicon, a suitable donor is arsine or phosphine, while a suitable acceptor is methyl borate. The flow of gas from each tank is regulated by flow meters 18 between each tank and the inlet 12.

A refractory furnace boat 19 is positioned within that portion of the furnace tube 11 which is surrounded by the furnace 14. A semiconductive substrate 20 is placed in the furnace boat 19. The substrate 20 suitably consists of a monocrystalline semiconductive body such as silicon or gallium arsenide or the like.

The furnace 14 is set to maintain the temperature inside the furnace tube 11 at about 580° to 700° C. The inert carrier gas utilized, which in this example is nitrogen, is first swept through the furnace tube 11 while the furnace 14 is warmed to the desired temperature. The rates of flow of the various reactants depend on the size and shape of the apparatus, and on the temperature of the furnace.

When the temperature inside furnace tube 11 has reached a predetermined level within the range of about 580° to 700° C., a mixture of the diluted silane from tank 16 and the conductivity modifier from tank 15 are passed through the inlet 12 into the furnace tube 11. The silane decomposes according to the reaction $$SiH_4 \rightarrow 2Si + 2H_2$$

A coating 21 of polycrystalline silicon is thus deposited on the substrate. Incorporated in polycrystalline layer 21 is some of the conductivity modifier from tank 17. The concentration of the conductivity modifier in the polycrystalline layer 21 can be varied by changing the relative rates of flow of the silane and of the conductivity modifier.

The carrier gas and any unreacted silane and conductivity modifier and the reaction products leave the system by way of the outlet 13. After the polycrystalline coating 21 has been deposited on the substrate 20 for the desired period of time, the flow of the silane mixture and the conductivity modifier is shut off, and the furnace 14 is switched off. When the temperature inside the furnace tube 11 has dropped to about 200° C., the flow of the carrier gas may be turned off completely, and the furnace boat 19 together with the coated substrate 209 may be removed from the furnace tube 11.

Alternatively, the coated semiconductive body 11 may be left in the furnace tube, and subsequent diffusion steps are performed in the same furnace tube without exposing the substrate to the atmosphere.

Second apparatus

In this method, the silane is decomposed in a hot furnace tube as in the method described above, but the substrate to be coated is not present in the furnace tube. Instead, the substrate is kept in a cooler environment completely outside the furinace tube. The reacting gases are swept out of the furnace tube, and rapidly cooled by forcing them through a jet so as to impinge upon the substrate, and thus form in the substrate a polycrystalline semiconductive layer. The special utility of this method is that only moderate heating of the substrate is required.

A form of apparatus 30 (FIGURE 2) useful in this embodiment comprises a refractory furnace tube 31 having an inlet tube 32 at one end, and a jet orifice 33 at the other end. Furnace tube 31 is positioned in a furnace 34. A carrier gas tank 15, a silane tank 16, and a conductivity modifier gas tank 17 feed into the inlet tube 32. The flow of gas from tanks 15–17 is controlled by flow meters 18 as in the previous example.

In this embodiment, a substrate 36 is kept out of the furnace tube 31 and out of the furnace 34. Instead, the substrate 36 in this example is positioned a short distance, generally less than 2″, from the jet orifice 33. The system is purged by a flow of the carrier gas from the tank 15 in the direction indicated by the arrow while the furnace is brought to a predetermined temperature in the range of about 580° to 700° C. A flow of silane and conductivity modifier is then passed into the furnace tube 31. The temperature of the furnace tube 31 is now sufficient to decompose the silane. The mixed vapors of the inert carrier gas, the unreacted conductivity modifier in the silane, and the reaction product exit from the furnace tube 31 by way of the jet orifice 33, and thus form a jet stream indicated by the arrow from the jet orifice 33. This jet stream is allowed to impinge upon the surface of the substrate 36. The jet stream cools off rapidly as it leaves the jet orifice 33, and hence the surface of the jet stream at the point where it impinges upon the substrate 36 may be varied by adjusting the distance between the jet orifice 33 and the substrate 36. A polycrystalline silicon coating 37 in which the conductivity modifier is incorporated is thus deposited on the substrate 36 while maintaining the substrate at a very moderate temperature. This method is particularly useful when the substrate is a semiconductor which cannot withstand high temperatures.

EXAMPLE I

Figure 3:
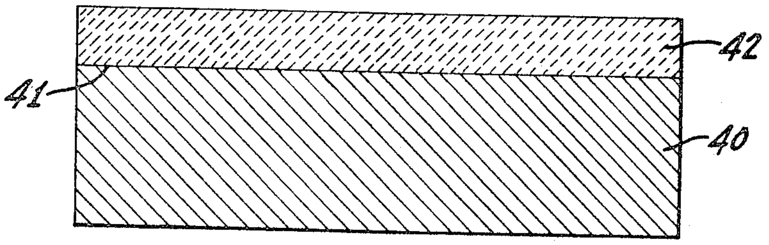
FIGURES 3–6 are cross-sectional views of a semiconductive body during successive steps in the fabrication of a semiconductive device according to one embodiment.

A crystalline semiconductive body 40 (FIGURE 3) is prepared with at least one major face 41. The precise size, shape, composition, and conductivity of semiconductive body 40 is not critical. In this example, semiconductive body 40 is about 50 mils square, about 6 mils thick, consists of monocrystalline silicon, and is of N type conductivity. A masking coating 42 is deposited on face 41 of body 40 by any convenient method. The coating 42 suitably consists of a refractory insulating material such as silicon oxide, silicon nitride, silicon oxynitride, or the like. When the semiconductive body 40 consists of silicon, as in this example, the coating 42 may consist of silicon oxide formed by heating the semiconductive body 40 in an oxidizing ambient.

Figure 4:
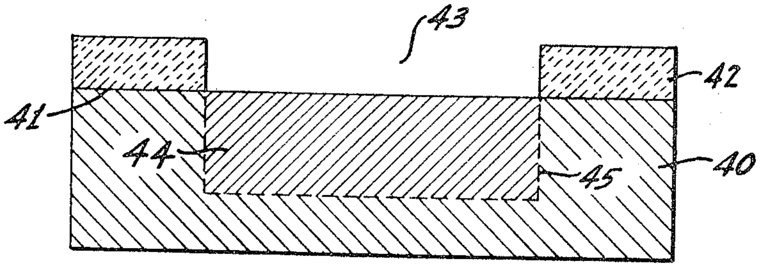

Standard photolithographic techniques are utilized to form an aperture 43 (FIGURE 4) in the masking coating 42, thus exposing a predetermined portion of face 41. The semiconductive body 40 is now treated in the vapors of a suitable conductivity modifier, which in this example is an acceptor such as boron, to form a P type region 44 in semiconductive body 40 immediately adjacent face 41. The size and shape of the diffused region 44 corresponds to the size and shape of aperture 43, since the remaining portions of coating 42 acts as a mask against the diffusion of the conductivity modifier. A PN junction 45 is formed at the interface or boundary between the P type diffused region 44 and the N type bulk of body 40.

Figure 5:
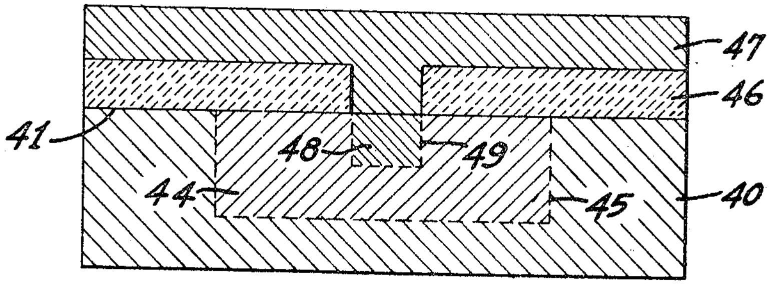

The remaining portions of the masking coating 42 are removed, and a fresh masking coating 46 (FIGURE 5) is deposited on face 41 of body 40. Coating 46 may for example consist of silicon nitride deposited by the reaction of silane and ammonia. Photolithographic methods are utilized to form an aperture in the masking coating 46. The aperture exposes a portion of face 41 completely internal the diffused region 44.

A layer 47 of doped polycrystalline silicon is now deposited over the masking layer 46 and over the exposed portion of face 41. Suitably, the polycrystalline silicon layer 47 is deposited by the decomposition of silane at a lower temperature than normally utilized for the deposition of monocrystalline silicon.

Monocrystalline silicon epitaxial layers are generally deposited by recomposing silane at temperatures above 1000° C. In contrast, the polycrystalline layer 47 is deposited by decomposing the silane at temperatures below 700° C. The polycrystalline silicon thus deposited has a highly polished shiny appearance. A small amount of a suitable volatile conductivity modifier is incorporated in the stream of silane. In this example, the conductivity modifier is phosphine.

The semiconductive body 40 is subsequently heated to form a phosphorus-diffused N type region 48 in semiconductive body 40 immediately adjacent face 41 and internal the P type diffused region 44. A PN junction 49 is formed at the boundary or interface between the N type diffused region 48 and the P type diffused region 44. The size and shape of the diffused region 48 corresponds to the size and shape of the aperture previously formed in masking layer 46.

Figure 6:
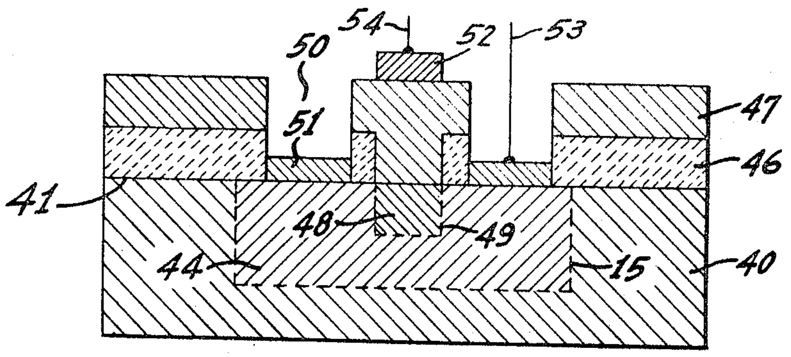

An aperture 50 (FIGURE 6) is formed in the silicon layer 47 and in the masking layer 46 so as to expose a portion of the diffused region 44. In this example, the aperture 50 is ring-shaped, and surrounds the diffused region 48. A ring-shaped metallic electrode 51 is deposited within the aperture on the exposed portion of face 41 within the aperture 50. Another metallic electrode 52 is deposited on the portion of the silicon layer 47 over the diffused region 48. Electrical lead wires 53 and 54 are attached to the electrodes 51 and 52 respectively. The remaining steps of mounting and casing the device are accomplished by standard methods of the art. The device thus fabricated is a bipolar triode transistor, wherein electrode 52 serves as the emitter electrode, and electrode 51 serves as the base electrode.

One advantage of the device thus fabricated is that the polycrystalline semiconductive layer 47 is not removed from the surface of the device, and acts as a protective cover over the device surface; more particularly as a cover over the surface intercept of the PN junction 49, which is never exposed to the atmosphere. Another advantage of the device is that the same polycrystalline semiconductive layer 47 which serves as a diffusion source and a device cover also serves as a device electrode. The fabrication steps required are thereby simplified, thus increasing the manufacturing yield and decreasing the unit cost.

EXAMPLE II

Figure 7:
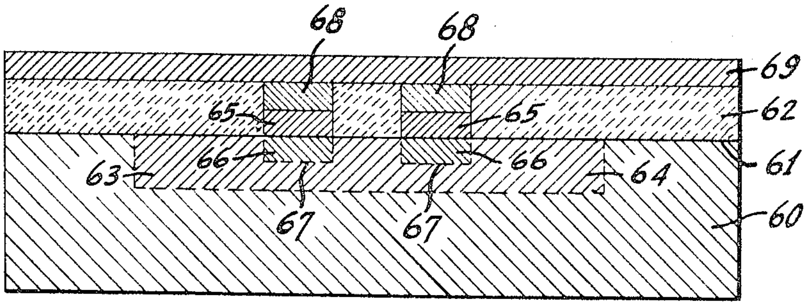
FIGURES 7–8 are cross-sectional views of a semiconductive body during successive steps in the fabrication of a semiconductive device according to another embodiment.

A crystalline semiconductive body 60 (FIGURE 7) of given conductivity type is prepared with at least one major face 61. The semiconductive body 60 may consist of silicon, germanium, gallium arsenide, silicon-germanium alloys, and the like. Standard masking and diffusing techniques are employed to form a diffused base region 63 of opposite conductivity type in body 60, immediately adjacent face 61. A rectifying barrier 64 is formed at the boundary between the diffused region 63 and the bulk of body 60. The rectifying barrier 64 becomes a base-collector junction of the device. Face 61 is masked with an insulating refractory coating 62. The coating 62 may for example consist of silicon oxide deposited as described in Jordan and Donahue U.S. Patent 3,089,793, issued May 14, 1963. A plurality of apertures are formed in the masking coating 62 so as to expose a plurality of areas of face 61, all of the exposed areas being within the boundaries of the diffused region 63. A thin layer 65 of polycrystalline silicon containing a suitable conductivity modifier is now deposited by the low temperature method described in Example I within each of the apertures in the masking layer 62. As the polycrystalline silicon layers 65 are deposited, some of the conductivity modifier in each layer 65 diffuses into the immediately adjacent portions of face 61, and forms a plurality of emitter regions 66 of given conductivity type. In the drawing, only two such emitter regions 66 are shown for greater clarity, but it will be understood that in practice, the number of such isolated emitter regions may exceed 100. The interface 67 between each shallow emitter region 66 and the base region 63 becomes one of the emitter-base junctions of the device.

In this embodiment, a layer of electrically resistive material 68 is deposited on each of the doped polycrystalline silicon layers 65. A wide variety of dielectric materials may be employed for this purpose. Advantageously, the dielectric layer 68 consists of high resistivity polycrystalline silicon deposited by the thermal decomposition of silane as described above, but without the addition of any doping agent. A layer 69 of heavily doped polycrystalline silicon is then deposited over the top of each dielectric layer 68 and over the top of the masking layer 62. The layer 69 is of the same conductivity type as the layers 65, and serves as an electrical contact to all of the emitter regions 66.

Figure 8:
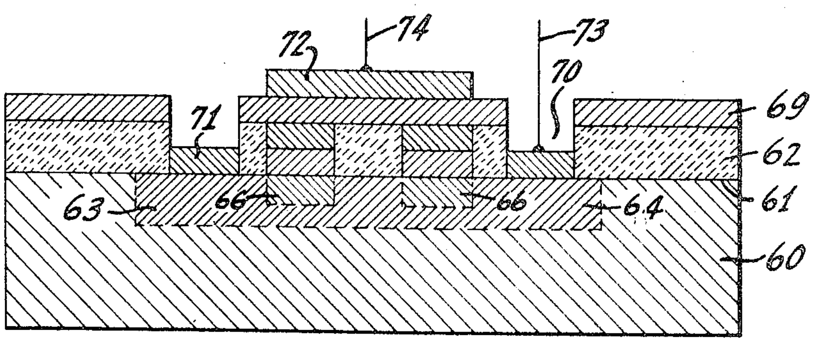

An opening 70 (FIGURE 8) is made in layers 62 and 69 to expose a portion of face 61 within the diffused base region 63. A metallic base electrode 71 is deposited on the portion of face 61 thus exposed. In this example, the base electrode 71 is annular, and extends around the plurality of discrete emitter regions 66. At the same time, a metallic emitter electrode 72 is deposited on the portion of layer 69 which interconnects all the emitter regions 66. Electrical lead wires 73 and 74 are attached to electrodes 71 and 72 respectively. The remaining steps of mounting and casing the device are accomplished by standard methods of the art.

In the operation of the device as a bipolar triode transistor, each of the dielectric layers 68 act as a resistance in series with the corresponding emitter region 66, and thus prevents the formation of "hot spots" at any one emitter site. The theory of operation is described in "Second Breakdown In Simplified Transistor Structures And Diodes," by R. M. Scarlett and W. Schroen, IEEE Transactions On Electron Devices, August–September 1966, pp. 619–626.

The above examples are by way of illustration only, and not by way of limitation. Other semiconductive materials may be utilized with appropriate conductivity modifiers. The conductivity type of the various device regions may be reversed. Various other modifications may be made without departing from the spirit and scope of the invention as set forth in the specification and the appended claims.

I claim:

1. A semiconductor junction device comprising:
(a) a monocrystalline semiconductive body of given conductivity type;
(b) a layer of low resistivity polycrystalline semiconductive material on a portion of the surface of said body, said polycrystalline layer having incorporated therein a conductivity modifier capable of altering the conductivity type of said body;
(c) a region of said body immediately adjacent said layer, said region having a conductivity type opposite that of said body;
(d) a rectifying junction between said region of said body and the remainder of said body;
(e) a layer of high resistivity material on said polycrystalline layer; and,
(f) an electrical connection to said high resistivity layer.

2. The device as in claim 1, wherein said monocrystalline body and said polycrystalline layer consist of the same kind of semiconductor material.

3. The device as in claim 1, wherein said monocrystalline body and said polycrystalline layer consist of silicon.

4. A semiconductor junction device comprising:
(a) a monocrystalline semiconductive body having a region of given conductivity type immediately adjacent one body surface;
(b) an insulating masking layer on portions of said one surface, said masking layer leaving exposed a plurality of discrete areas of said one surface within said given conductivity type region:
(c) a deposit of low resistivity polycrystalline semiconductive material on each of said exposed discrete areas only, said deposit having incorporated therein a conductivity modifier capable of altering the conductivity type of said body;
(d) a plurality of regions of opposite conductivity type in said body, said regions being immediately adjacent said discrete areas of said one surface;
(e) a rectifying barrier between said region of given conductivity type and each of said regions of opposite conductivity type;
(f) a deposit of high resistivity material on each of said deposits of low resistivity polycrystalline material;
(g) a layer of low resisitivity polycrystalline semiconductive material on said masking layer and on each of said deposits of high resistivity material, said low resistivity layer connecting all of said high resistivity deposits; and,
(h) an electrical connection to said low resistivity polycrystalline layer.

5. A device as in claim 4, wherein said semiconductive body, said polycrystalline material, and said high resistivity layer all consist of silicon.

6. A method of fabricating a semiconductor junction device comprising:
(a) depositing a layer of polycrystalline semiconductive material on at least a portion of a surface of a monocrystalline semiconductive body, said polycrystalline layer having incorporated therein a conductivity modifier capable of altering the conductivity type of said body;
(b) heating said body to diffuse said conductivity modifier from said polycrystalline layer into that portion only of said body which is immediately adjacent said polycrystalline layer to alter the conductivity type of said portion;
(c) depositing a layer of high resistivity material on said polycrystalline layer; and,
(d) forming an electrical contact to said high resistivity layer.

7. A method of fabricating a semiconductor junction device comprising:
(a) forming a monocrystalline semiconductive body with a region of given conductivity type immediately adjacent one surface of said body;
(b) depositing an insulating masking layer on said one surface to expose a plurality of discrete portions of said given type region;
(c) depositing a first layer of low resistivity polycrystalline semiconductive material as discrete portions on each of said discrete portions only of said given type region, said low resistivity semiconductive material having incorporated therein a conductivity modifier capable of altering the conductivity type of said body;
(d) heating said body to diffuse said conductivity modifier from said discrete portions of said first polycrystalline semiconductive layer into said discrete portions only of said given conductivity type region, and thereby convert said portions to opposite conductivity type;
(e) depositing a layer of high resistivity material as discrete portions on each said discrete portion of said first polycrystalline layer;
(f) depositing a second layer of said low resistivity polycrystalline material on said high resistivity layer, and on portions of said masking layer, said second layer of polycrystalline material connecting all said discrete portions of said high resistivity layer; and,
(g) forming an electrical contact to said second layer of low resistivity polycrystalline material.

8. A method as in claim 7, wherein said monocrystalline body and said polycrystalline layers consist of silicon.

References Cited

UNITED STATES PATENTS

| | | | |
|---|---|---|---|
| 2,780,569 | 2/1957 | Hewlett | 148—1.5 |
| 3,189,973 | 6/1965 | Edwards et al. | 317—235 X |
| 3,357,871 | 12/1967 | Jones | 148—175 |
| 3,375,418 | 3/1968 | Garnache et al. | 317—235 |

JAMES D. KALLAM, Primary Examiner

U.S. Cl. X.R.

29—576; 317—234